United States Patent
Sun

[11] Patent Number: 5,811,283
[45] Date of Patent: Sep. 22, 1998

[54] SILICON ON INSULATOR (SOI) DRAM CELL STRUCTURE AND PROCESS

[75] Inventor: Shih-wei Sun, Taipei, Taiwan

[73] Assignee: United Microelectronics Corporation, Hsin-chu, Taiwan

[21] Appl. No.: 740,148

[22] Filed: Oct. 22, 1996

Related U.S. Application Data

[60] Provisional application No. 60/023,871 Aug. 13, 1996.
[51] Int. Cl. [6] .............................................. H01L 21/8242
[52] U.S. Cl. ........................................... 438/244; 438/155
[58] Field of Search .................................. 438/155, 156, 438/243, 244, 270, 386, 387

[56] References Cited

U.S. PATENT DOCUMENTS

| | | | |
|---|---|---|---|
| 5,466,625 | 11/1995 | Hsieh et al. | 438/155 |
| 5,504,027 | 4/1996 | Jeong et al. | 438/244 |
| 5,618,745 | 4/1997 | Kita | 438/155 |

OTHER PUBLICATIONS

Fan, J., "*New Anatomies for Semiconductor Wafers,*" IEEE Spectrum, Apr. 1989, pp. 34–38.
Kim, H. et al., "*A High Performance 16M DRAM on a Thin Film SOI,*" 1995 Symposium on VLSI Technology Digest of Technical Papers, Apr. 1995, pp. 143–144.
Wolf, "*Silicon Processing for the VLSI Era, vol. 2: Process Integration,*" pp. 68–78 (1990).

*Primary Examiner*—Chandra Chaudhari
*Attorney, Agent, or Firm*—William H. Wright

[57] ABSTRACT

A silicon on insulator (SOI) DRAM has a layer of buried oxide covered by a thin layer of crystalline silicon on the surface of a bulk silicon substrate. Field oxide regions are formed extending through the thin crystalline silicon surface layer and into contact with the buried oxide layer. Gate oxide layers, gate electrodes and source/drain regions for the transfer FETs of the DRAM are formed in and on the thin crystalline silicon surface layer in the active regions between the field oxide regions. A trench is opened through one of the source/drain regions of each of the transfer FETs. A layer of doped polysilicon is provided to line the trenches and is patterned to form at least a part of the bottom electrodes of the charge storage capacitors for the DRAM. The bottom electrodes are covered with a thin dielectric layer and an upper electrode of doped polysilicon is provided. Preferably, the trench for the bottom capacitor electrode extends through the buried oxide layer and may extend into the bulk silicon.

6 Claims, 3 Drawing Sheets

SILICON ON INSULATOR (SOI) DRAM CELL STRUCTURE AND PROCESS

This application claims priority from provisional application Ser. No. 60/023,871, filed Aug. 13, 1996.

BACKGROUND OF THE INVENTION

1. Field of the Invention

The present invention relates to the formation of dynamic random access memories (DRAMs) having improved performance including, for example, higher speed operation and greater soft-error immunity.

2. Description of the Related Art

Dynamic random access memories incorporate an array of charge storage capacitors and a corresponding array of transfer field effect transistors used as switches for selectively coupling individual ones of the charge storage capacitors to associated bit lines during data writing and reading operations. A typical DRAM cell incorporates a charge storage capacitor and a transfer field effect transistor (FET) having one source/drain region connected to a bit line and a second source/drain region connected to one electrode of the charge storage capacitor. For high density DRAMs, the transfer FET and the charge storage capacitor are made small and are packed closely together. Adjacent DRAM cells are packed as closely as possible. The close packing of DRAM cells is facilitated by including lateral device isolation structures, such as field oxide regions, between adjacent cells. The width and thickness of field oxide isolation regions are preferably optimized to minimize parasitic transistor action between the source/drain regions of adjacent FETs. Making field oxide regions wider increases the length of the parasitic FET channels which run under the field oxide isolation regions, increasing device isolation and reducing the likelihood of parasitic transistor action. Of course, providing wider field oxide regions reduces the density of the resulting DRAM, so that selection of the width of the field oxide regions involves a trade-off to optimize performance. Making field oxide regions thicker increases the separation between wiring lines on top of the field oxide regions and the channels of the parasitic FETs, again reducing parasitic transistor action. It is, however, difficult to form thick field oxide regions without making the field oxide regions wider. Smaller, more effective device isolation structures are desirable to improve the density and performance of modern DRAM structures.

Other aspects of DRAM structure might also be modified to improve DRAM performance. A particular aspect of DRAM performance that might be improved is the switching speed of the transfer FETs, which could be reduced by reducing the parasitic capacitance coupled to the source/drain regions of the FETs. Some of the sources of parasitic capacitance that couple to the FET source/drain regions are due to the capacitances associated with the P/N junctions between the source/drain regions and various doped regions formed adjacent to the source/drain regions. Often, the physical isolation provided by field oxide isolation regions is augmented by implanting ions under the field oxide regions to increase the threshold voltage of the parasitic FET, reducing the likelihood of parasitic transistor action. The channel stop implantations typically are of the opposite conductivity type from the source/drain implantations so that P/N junctions are formed at the interface between the source/drain regions and the channel stop regions. The capacitance of these P/N junctions couple to the transfer FET source/drain regions to reduce the switching speed of the transfer FETs. Other aspects of FET formation can also lead to increased levels of parasitic capacitance coupled to the source/drain regions of the DRAM's transfer FETs. To limit short channel effects in very small FETs, an implantation (a "punchthrough" or "anti-punchthrough" implant) of P-type dopants is made below the channel region of the FET into the lightly doped P-type substrate conventionally used in DRAMs. The anti-punchthrough implantation is generally made to have a peak concentration at or just below the lower edge of the source/drain implantations. Here again, the source/drain regions generally form a P/N junction with the anti-punchthrough implantation, and the capacitance of these P/N junctions can further slow the switching speed of the transfer FETs.

A strategy for improving the effectiveness of field isolation regions and for reducing parasitic capacitances is to use silicon substrates having buried oxide regions, i.e., silicon-on-insulator (SOI) substrates, for forming DRAMs. Such a DRAM is described in the article, Kim, et al., *A High Performance 16M DRAM on a Thin Film SOI*, 1995 *Symposium on VLSI* 143–144 (1995). Typically, SOI substrates incorporate a bulk silicon substrate with a relatively thin layer of silicon oxide covered by a thin surface layer of crystalline silicon on one surface of the substrate. In an SOI DRAM, the transfer FETs and charge storage capacitors that make up the cell s of the DRAM are formed on the surface layer of crystalline silicon and the buried silicon oxide layer separates the silicon surface layer from the bulk silicon substrate. Field oxide isolation regions are formed through the surface silicon layer, extending down to the buried silicon oxide layer so that the active device regions of the DRAM are enclosed laterally by the field oxide regions and are enclosed vertically by the buried silicon oxide region. Since the active device regions are completely enclosed within insulators, channel stop implantations are typically unnecessary, removing this source of parasitic capacitance from the transfer FETs of the SOI DRAM. The use of a buried oxide structure provides the further advantage of reducing the soft error rate in the resulting SOI DRAM.

A disadvantage of the DRAM structure described in the Kim, et al., article is that the DRAM structure is formed entirely above the thin silicon surface layer. As a consequence of this design choice, the capacitance for the DRAM structure is provided entirely by a stacked superstructure formed on an insulating layer covering the substrate. Such a stacked capacitor structure makes the surface topography of the DRAM uneven in a manner that can make difficult further high resolution processing steps which have a limited depth-of-focus budget. A further disadvantage of using a stacked capacitor superstructure as the charge storage capacitor of the DRAM is that the structure cannot readily be scaled to higher DRAM densities without making the DRAM surface topography even more uneven.

SUMMARY OF THE PREFERRED EMBODIMENTS

Figure 1:
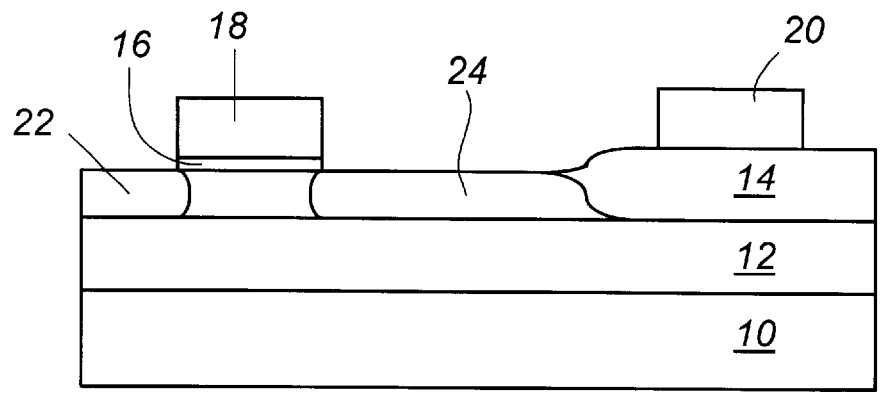
FIGS. 1–5 schematically illustrate process steps for forming a DRAM on an SOI substrate.

It is accordingly an object of the present invention to provide an SOI DRAM structure that provides greater flexibility in designing capacitor structures, and a method for forming such a structure. This is accomplished in preferred embodiments of the present invention by forming a charge storage capacitor extending into the thin silicon layer at the surface of the SOI DRAM. Such a structure can provide higher levels of DRAM cell capacitance without a more extensive superstructure.

One aspect of the present invention provides a silicon on insulator memory having a substrate with a silicon surface layer covering a buried silicon oxide layer and field isolation regions formed on the surface of the substrate, the field isolation regions extending through the silicon surface layer and making contact with the buried silicon oxide layer, the field isolation regions defining active device regions on the silicon surface layer. First and second source/drain regions are formed in an active device region, the first and second source/drain regions defining a channel region in the silicon surface layer. A gate oxide layer is on the channel region and a gate electrode is on the gate oxide layer. A trench is formed through the first source/drain region, through the silicon surface layer and into the buried silicon oxide layer. A lower capacitor electrode extends into the trench, with a dielectric layer on the lower capacitor electrode and an upper capacitor electrode.

Another aspect of the present invention provides a method of making a memory comprises providing a substrate having a surface layer of silicon and a buried insulating layer under the surface layer of silicon. Field isolation structures are formed in and on the surface layer of silicon, thereby defining active device regions on the surface layer of silicon. A layer of oxide is formed on the active device regions of the substrate and gate electrodes are formed on the layer of oxide. First and second source/drain regions in the surface layer of silicon and a layer of insulating material is deposited over the gate electrodes. A mask is formed over the layer of insulating material having openings over the first source/drain regions and then trenches are etched through the layer of insulating material, the surface layer of silicon and into the buried insulating layer. The method continues by depositing a first layer of polysilicon to line the trenches and then patterning the first layer of polysilicon to define, at least in part, lower capacitor electrodes, providing a dielectric layer over the lower capacitor electrode; and depositing a second layer of polysilicon and forming upper capacitor electrodes.

DETAILED DESCRIPTION OF THE PREFERRED EMBODIMENTS

Conventional silicon on oxide (SOI) DRAM structures rely on the use of finned capacitor electrodes that do not extend below the surface of the substrate. By contrast, particularly preferred embodiments of the present invention provide a DRAM incorporating a charge storage capacitor formed at least partially within the SOI substrate. For example, a trench may be formed through one of the source/drain regions of the transfer FET and a doped polysilicon electrode is formed at least partially within the trench. Even when this trench extends entirely through the buried oxide region and into contact with the bulk silicon substrate, the capacitance of the source/drain region in contact with the lower electrode of the trench capacitor is not increased in a way that undesirably affects the switching speed of the transfer FET.

A silicon on insulator (SOI) DRAM has a layer of buried oxide covered by a thin layer of crystalline silicon on the surface of a bulk silicon substrate. Field oxide regions are formed extending through the thin crystalline silicon surface layer and into contact with the buried oxide layer. The transfer FETs for the DRAM are formed in the active regions between the field oxide regions, with the gate oxide layers, polysilicon gate electrodes and source/drain regions being formed in and on the thin silicon surface layer of the SOI substrate. In preferred embodiments of the invention, a trench is etched through one of the source/drain regions of each of the transfer FETs. A layer of doped polysilicon is provided to line the trench so that the doped polysilicon layer is in electrical contact with the source/drain region of the transfer FET. The doped polysilicon layer is patterned to form at least a part of the bottom electrodes of a charge storage capacitor for the DRAM. The bottom electrode is covered with a thin dielectric layer and with an upper electrode of doped polysilicon or another conductive material. Preferably, the trench for the bottom capacitor electrode extends through the buried oxide layer and may extend into the bulk silicon. The resulting charge storage capacitor has a lower profile than a corresponding capacitor that relies solely on a finned superstructure.

Preferred embodiments of the present invention provide a DRAM formed on a substrate having a buried oxide layer. Suitable substrates can be formed by a variety of techniques including, for example, "SIMOX" (separation by implanted oxygen) and bonded SOI in which layers of crystalline silicon and silicon oxide are physically attached to a silicon or other substrate, sometimes using electrostatic adhesion between silicon oxide layers. An additional strategy for forming silicon on insulator structures is the crystallization of an amorphous silicon layer deposited on a silicon oxide layer. This technique, "zone melting recrystallization," as well as the SIMOX technique, are described in the textbook, Wolf, *Silicon Processing for The VLSI Era, Volume 2: Process Integration* 66–78 (1990), which is hereby incorporated by reference. In many instances, it is preferable to form substrates by the SIMOX technique because of its similarity to processing techniques typically employed in semiconductor processing. The SIMOX technique is facilitated by the more ready availability of high energy, high current implanters.

FIG. 1 illustrates an SOI DRAM at an intermediate stage of manufacture. Bulk silicon substrate 10 has a silicon oxide layer 12 buried within the substrate. The silicon oxide layer 12 may have a thickness of approximately 1000–5000 Å depending, for example, on the energy distribution of the oxygen ions implanted into the substrate if the SIMOX process is used. The upper boundary of the buried oxide layer may be at a depth of about 1000–3000 Å or more. Of course, if other techniques are used for forming the substrate, or if the SIMOX procedure is varied, these conditions may vary considerably. Field oxidation regions 14 are formed in the thin layer of crystalline silicon remaining on the surface of the substrate, preferably extending all the way through the thin silicon layer to contact the buried silicon oxide layer 12. The field oxidation regions might be formed by any of the known methods, with the illustrated field oxidation region 14 being formed by the conventional local oxidation of silicon ("LOCOS") technique. It should be appreciated that, in many instances, shallow trench isolation in which trenches are etched into the substrate and filled at least partially with insulating material will be better suited for use in the SOI DRAM described herein.

If necessary, a threshold adjust implantation can be made at this point in the process or, alternately, a threshold adjust implantation into the active device regions of the silicon surface layer could be performed later in the DRAM manufacturing process. A gate oxide layer 16 is then formed by thermal oxidation on the active regions of the thin layer of silicon at the surface of the substrate. Polysilicon is deposited onto the gate oxide layer 16 and the polysilicon layer is doped, either during deposition or by ion implantation and subsequent annealing. The doped polysilicon layer is patterned to define gate electrode 18 and wiring line 20 overlying the field oxidation region 14. While a single polysilicon layer is illustrated for the gate electrode of the transfer FET, others of the various known gate configurations could alternately be used for the gate electrode of the illustrated FET. For example, a layer of oxide might be formed over the polysilicon gate electrode or a multilayer (i.e., polycide) gate electrode structure might be used.

Next, implantation of dopants, typically an N-type impurity and preferably phosphorus, is performed to create source/drain regions 22, 24. If it is desirable to form a lightly doped drain (LDD) structure for source/drain regions, then it is preferred that insulating spacer structures be provided alongside the gate electrodes after an initial comparatively light implantation step, followed by a heavier implantation of the same kind of dopant. In at least some cases it will be more desirable to form source/drain regions that are uniformly doped N-type with a total dopant level that is below that used in at least some conventional bulk source/drain regions. This is so because the structure of the SOI DRAM incorporates a significant level of lattice strain in the surface silicon layer, caused by the lattice mismatch between the buried oxide (e.g., $SiO_2$) layer and silicon. Due to the lattice strain that is likely present in at least portions of the surface layer of silicon, the implantation of impurities may generate more severe levels of lattice damage than it typical. In addition, the strain in the lattice may prevent the annealing of implantation damage from eliminating defects; rather, prolonged attempts to anneal out lattice damage may cause lattice defects to multiply or propagate. Thus, it is desirable to minimize the level of implantations and, for appropriate device geometries, design tradeoffs may dictate that the lower defect densities associated with lower dosages of ion implantations may provide improved performance despite the lower conductivity of the source/drain regions. In addition, as will be described in greater detail below, diffusion from a doped polysilicon layer within the lower electrode of the charge storage capacitor can be used provide higher levels of doping without lattice damage for at least some of the source/drain regions of the DRAM FETs.

The implantation of impurities into the source/drain regions 22, 24 and the subsequent annealing of the implanted impurities also defines a channel region 26 beneath the gate electrode 18. As is schematically illustrated in the figure, the active region of the transfer FETs of an SOI DRAM in accordance with preferred embodiments of the present invention are isolated laterally by field oxidation regions 14 and vertically by the buried oxide layer 12. After the processing steps illustrated in FIG. 1 are complete, a relatively thick layer of insulating material is deposited over the surface of the device. For example, a layer of silicon oxide 28 may be deposited by chemical vapor deposition (CVD) using a TEOS (tetra-ethyl-ortho-silicate) source gas to a thickness of approximately 3000 Å. Preferably, the surface of the insulating layer is planarized, either by an etch-back procedure or by chemical mechanical polishing. Next, a photoresist etching mask (not shown in the figures) is formed over the insulating layer and a portion of the insulating layer 28 is removed, providing an opening 30 in the insulating layer. Insulating layer 28 is preferably etched in a substantially anisotropic manner by performing reactive ion etching (RIE) using $CF_4$ as a source gas, if the insulating layer is silicon oxide.

Figure 2:
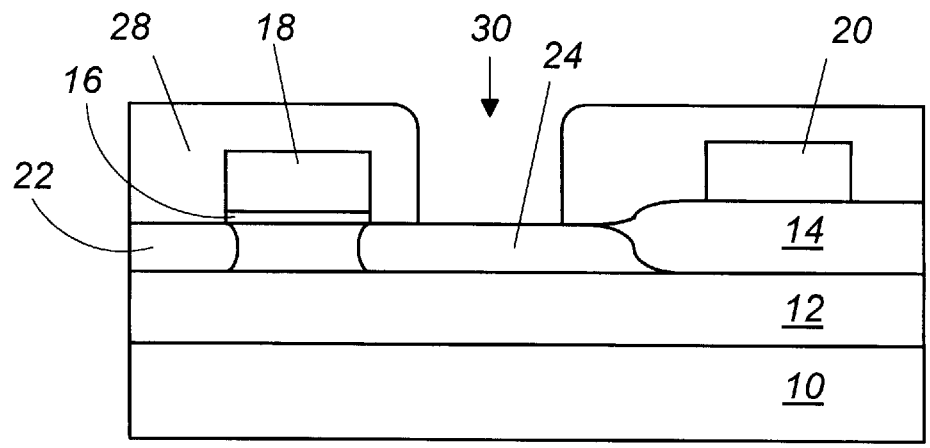

A portion of source/drain region 24 is preferably exposed in this process, as illustrated in FIG. 2. It is important that the opening 30 be narrower than the source/drain region 24 and that the opening 30 be offset from the channel region 26 by a sufficient amount the ensure that the source/drain region 24 functions acceptably as a source/drain contact in the finished DRAM cell. Either the photoresist mask used for etching insulating layer 28 is left in place for the subsequent etching steps, or the photoresist mask is removed and the insulating layer 28 is used as a mask for the subsequent steps of etching the capacitor trench. After the insulating layer is etched, the trench etching continues by etching through the N-type source/drain region 24, typically using RIE with a mixture of chlorine and bromine bearing source gases, for example, HCl and HBr. The buried oxide layer 12 can act as an etch stop for the etching of the thin silicon surface layer 14. Preferably, trench etching then continues by etching through the buried oxide layer 12, for example, by RIE using $CF_4$ as a source gas. Bulk silicon substrate 10 can act as an etch stop for the etching of the buried silicon oxide layer 12. The structure at this intermediate processing stage is illustrated schematically in FIG. 3.

Figure 4:
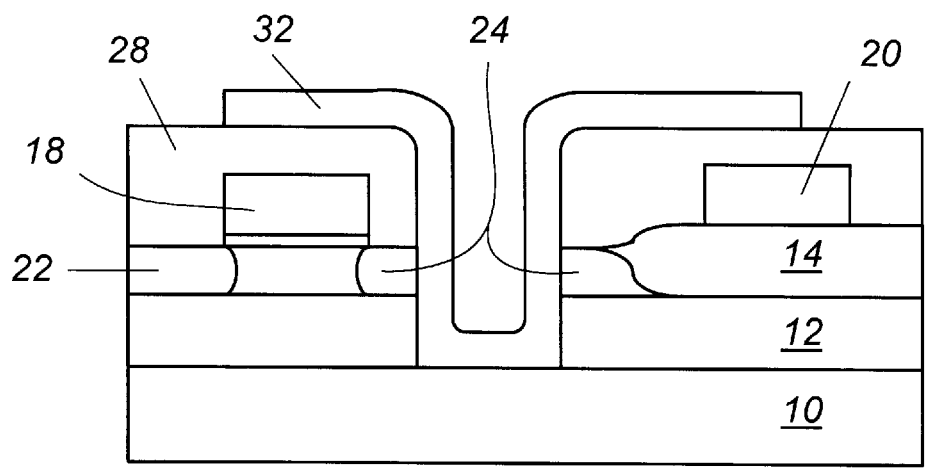

After the trench is formed, a layer of polysilicon is deposited in a suitably conformal manner, preferably by low pressure chemical vapor deposition from a silane source gas at a temperature of between about 600°–650° C. The layer is typically deposited to a thickness of between about 1500–2500 Å and the layer is conventionally doped by blanket ion implantation of phosphorus or arsenic ions at a dose of about $0.5$–$2.0 \times 10^{16}/cm^2$. Depending on the particular annealing operation chosen for activating this implantation, it is possible to diffuse ions from the doped polysilicon layer into the source/drain region 24, if it is desirable to improve the conductivity of source/drain region 24. Often, however, the annealing step will be performed using a rapid thermal anneal at a temperature of between about 900°–1000° C. for between about 10–30 seconds. A photoresist mask is then provided on the polysilicon layer and etching is performed to define the extent of the lower electrode 32 of the charge storage capacitor. The mask is then removed to produce the structure shown in FIG. 4.

Figure 5:
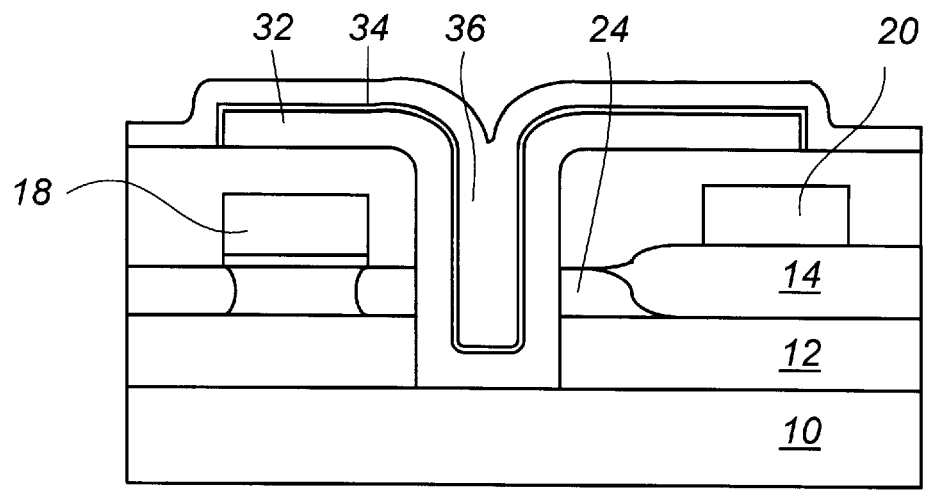

The doped polysilicon lower electrode 32 is then covered with a capacitor dielectric layer 34. The dielectric layer 34 is preferably thin, between about 40–200 Å thick. An appropriate dielectric layer may be, for example, an oxide layer formed by oxidation at a temperature of between about 800°–900° C. for about five minutes. Alternately, a series of thin dielectric layers consisting of silicon nitride (about 70 Å) and silicon oxide (about 20 Å) forming a two-layer "NO" dielectric, or of a very thin silicon oxide layer, silicon nitride and silicon oxide ("ONO") can be formed as the dielectric layer 34. Other high dielectric constant films might also be formed. For example, $Ta_2O_5$ or barium strontium titanate are likely to be preferred when these materials can be made with sufficient uniformity and reliability. Finally, a surface layer 36 of doped polysilicon is deposited over the dielectric layer 34 to serve as the upper electrode of the charge storage capacitor, as shown in FIG. 5. Further conventional processing is performed to complete the charge storage capacitor and the rest of the SOI DRAM.

Figure 3:
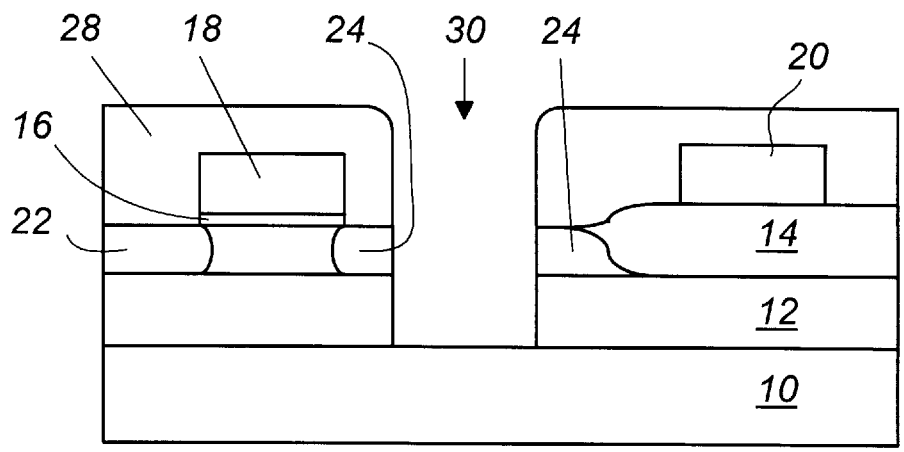
Figure 6:
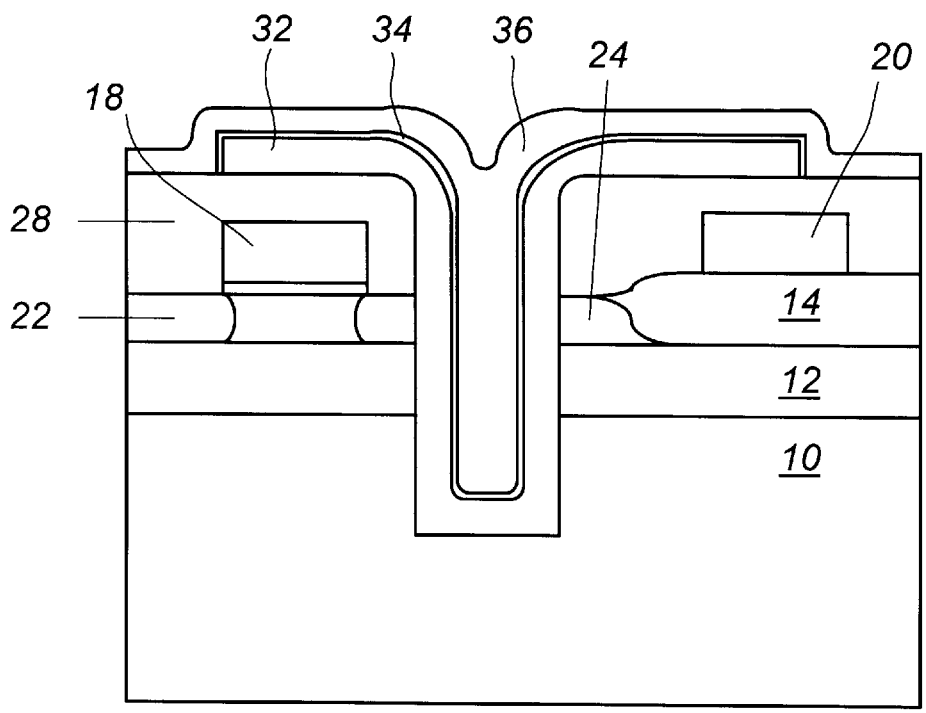
FIG. 6 shows an alternate configuration of an SOI DRAM.

FIG. 6 shows an alternate configuration of the trenched SOI DRAM cell, in which the trench extends into the bulk substrate 10. To form the FIG. 6 structure, a further etching step, following the buried oxide etching step illustrated in FIG. 3, is provided to etch the trench into the substrate. The bulk substrate etch can be performed in the same manner as the etching of the source/drain region 24 and may extend for 2000–4000 Å, or as desired. Subsequent processing performs in the conventional manner.

The present invention has been described in terms of certain preferred embodiments. The invention is not, however, limited to the specific embodiments described, but also includes such modifications and variations as fall within the scope of the following claims.

What is claimed:

1. A method of making a memory comprising:

providing a substrate having a surface layer of silicon and a buried insulating layer under the surface layer of silicon;

forming field isolation structures in and on the surface layer of silicon, thereby defining active device regions on the surface layer of silicon;

forming a layer of oxide on the active device regions of the substrate;

forming gate electrodes on the layer of oxide;

forming first and second source/drain regions in the surface layer of silicon;

depositing a layer of insulating material over the gate electrodes;

forming a mask over the layer of insulating material having openings over the first source/drain regions;

etching trenches through the layer of insulating material, the surface layer of silicon and into the buried insulating layer;

depositing a first layer of polysilicon to line the trenches and then patterning the first layer of polysilicon to define, at least in part, lower capacitor electrodes;

providing a dielectric layer over the lower capacitor electrode; and depositing a second layer of polysilicon and forming upper capacitor electrodes.

2. The method of claim 1, wherein the first and second source/drain regions are formed by implanting impurities into the substrate using the gate electrodes at least partially as a partial mask, forming first and second source drain regions on either side of the gate electrodes.

3. The method of claim 1, wherein the lower capacitor electrodes are formed in contact with the first source/drain regions.

4. The method of claim 2, wherein the lower capacitor electrodes are doped with an impurity and wherein, after deposition of the first polysilicon layer, annealing is performed to diffuse impurities from the lower capacitor electrodes into the surface silicon layer.

5. The method of claim 2, wherein the substrate is formed on a silicon substrate by implantation of oxygen ions into the substrate.

6. The method of claim 1, wherein the trench passes through the first source/drain region, with portions of the first source/drain region remaining on either side of the trench.

* * * * *